(12) United States Patent
Ikura

(10) Patent No.: US 9,711,629 B2
(45) Date of Patent: Jul. 18, 2017

(54) SEMICONDUCTOR DEVICE HAVING LOW-DIELECTRIC-CONSTANT FILM

(71) Applicant: FUJI ELECTRIC CO., LTD., Kanagawa (JP)

(72) Inventor: Yoshihiro Ikura, Matsumoto (JP)

(73) Assignee: FUJI ELECTRIC CO., LTD., Kanagawa (JP)

( * ) Notice: Subject to any disclaimer, the term of this patent is extended or adjusted under 35 U.S.C. 154(b) by 0 days.

(21) Appl. No.: 14/970,545

(22) Filed: Dec. 16, 2015

(65) Prior Publication Data

US 2016/0240638 A1   Aug. 18, 2016

(30) Foreign Application Priority Data

Feb. 16, 2015   (JP) .................. 2015-027742

(51) Int. Cl.
*H01L 29/40* (2006.01)
*H01L 29/06* (2006.01)
*H01L 29/739* (2006.01)
*H01L 29/49* (2006.01)
*H01L 29/51* (2006.01)

(52) U.S. Cl.
CPC ...... *H01L 29/7397* (2013.01); *H01L 29/0619* (2013.01); *H01L 29/402* (2013.01); *H01L 29/408* (2013.01); *H01L 29/0696* (2013.01); *H01L 29/49* (2013.01); *H01L 29/511* (2013.01)

(58) Field of Classification Search
CPC ............. H01L 29/7397; H01L 29/0649; H01L 29/0696
See application file for complete search history.

(56) References Cited

U.S. PATENT DOCUMENTS

| | | | | |
|---|---|---|---|---|
| 4,160,991 A | * | 7/1979 | Anantha | H01L 21/033 |
| | | | | 148/DIG. 122 |
| 5,329,142 A | | 7/1994 | Kitagawa et al. | |
| 8,236,639 B2 | * | 8/2012 | Kikuchi | H01L 29/402 |
| | | | | 257/E21.544 |

(Continued)

FOREIGN PATENT DOCUMENTS

| | | |
|---|---|---|
| JP | 2006-245477 A | 9/2006 |
| JP | 2009-81385 A | 4/2009 |

OTHER PUBLICATIONS

M. Yamaguchi et al., "IEGT Design Criterion for Reducing EMI Noise," Proceedings of 2004 International Symposium on Power Semiconductor Devices & ICs, May 2004, pp. 115-118.

(Continued)

*Primary Examiner* — John C Ingham
*Assistant Examiner* — Gustavo Ramallo

(57) ABSTRACT

Provided is a semiconductor device including a plurality of trenches, including an emitter electrode; a floating layer of a first conduction type provided between adjacent trenches; and a low-dielectric-constant film provided between the floating layer and the emitter electrode, in which a dielectric constant of the low-dielectric-constant film is less than 3.9. Also provided is a semiconductor device further including a gate electrode formed in the trenches, in which capacitance between the gate electrode and the floating layer is greater than capacitance between the emitter electrode and the floating layer.

14 Claims, 8 Drawing Sheets

(56) References Cited

U.S. PATENT DOCUMENTS

| | | | |
|---|---|---|---|
| 8,319,278 B1* | 11/2012 | Zeng | H01L 29/7813 257/330 |
| 2001/0054738 A1 | 12/2001 | Momota et al. | |
| 2003/0022483 A1* | 1/2003 | Shroff | H01L 21/76832 438/637 |
| 2005/0029593 A1 | 2/2005 | Kudo et al. | |
| 2005/0067672 A1* | 3/2005 | Toyoda | H01L 21/8222 257/565 |
| 2009/0291520 A1* | 11/2009 | Yoshikawa | H01L 27/0248 438/55 |
| 2014/0124829 A1* | 5/2014 | Andenna | H01L 29/1095 257/139 |

OTHER PUBLICATIONS

Y. Onozawa et al., "Development of the next generation 1200 V trench-gate FS-IGBT featuring lower EMI noise and lower switching loss," Proceedings of the 19th International Symposium on Power Semiconductor Devices & ICs, of May 27 to 30, 2007, pp. 13-16.

* cited by examiner

SEMICONDUCTOR DEVICE HAVING LOW-DIELECTRIC-CONSTANT FILM The contents of the following Japanese patent application(s) are incorporated herein by reference:
2015-027742 filed in JP on Feb. 16, 2015

BACKGROUND

1. Technical Field

The present invention relates to a semiconductor device. In particular, the present invention relates to a semiconductor device in which the dielectric constant of the low-dielectric-constant film is less than 3.9.

2. Related Art

Conventionally, an IGBT (Insulated Gate Bipolar Transistor) is known that includes a floating p region in a semiconductor device having a plurality of trench gates. A conventional semiconductor device uses a BPSG (Boron Phosphorous Silicon Glass) film in an inter-layer insulating film between the floating p region and an emitter electrode, as shown in Patent Document 1, for example.
Patent Document 1: Japanese Patent Application Publication No. 2006-245477
Patent Document 2: Japanese Patent Application Publication No. 2009-81385
Patent Document 3: Japanese Patent Application Publication No. 2005-57238
Patent Document 4: Japanese Patent Application Publication No. H5-243561
Patent Document 5: Japanese Patent Application Publication No. 2001-308327
Non-Patent Document 1: M. Yamaguchi et al., "IEGT Design Criterion for Reducing EMI Noise," Proceedings of 2004 International Symposium on Power Semiconductor Devices & ICs, May 2004, pp. 115-118
Non-Patent Document 2: Y. Onozawa et al., "Development of the next generation 1200 V trench-gate FS-IGBT featuring lower EMI noise and lower switching loss," Proceedings of the 19$^{th}$ International Symposium on Power Semiconductor Devices & ICs, 27$^{th}$ to 30$^{th}$ of May 2007, pp. 13-16

However, with an IGBT using conventional BPSG in the inter-layer insulating film, the potential of the floating p region draws near the potential of the emitter electrode. Specifically, in a conventional semiconductor device, a potential difference occurs between the floating p region and the gate electrode, and therefore there is a problem that when the semiconductor device is turned ON, a displacement current flows from the floating p region to the gate electrode.

SUMMARY

Therefore, it is an object of an aspect of the innovations herein to semiconductor device, which is capable of overcoming the above drawbacks accompanying the related art. The above and other objects can be achieved by combinations described in the claims. According to a first aspect of the present invention, provided is a semiconductor device comprising a plurality of trenches, including an emitter electrode; a floating layer of a first conduction type provided between adjacent trenches; and a low-dielectric-constant film provided between the floating layer and the emitter electrode, in which a dielectric constant of the low-dielectric-constant film is less than 3.9.

The summary clause does not necessarily describe all necessary features of the embodiments of the present invention. The present invention may also be a sub-combination of the features described above.

DESCRIPTION OF EXEMPLARY EMBODIMENTS

Hereinafter, some embodiments of the present invention will be described. The embodiments do not limit the invention according to the claims, and all the combinations of the features described in the embodiments are not necessarily essential to means provided by aspects of the invention.

First Embodiment

Figure 1:
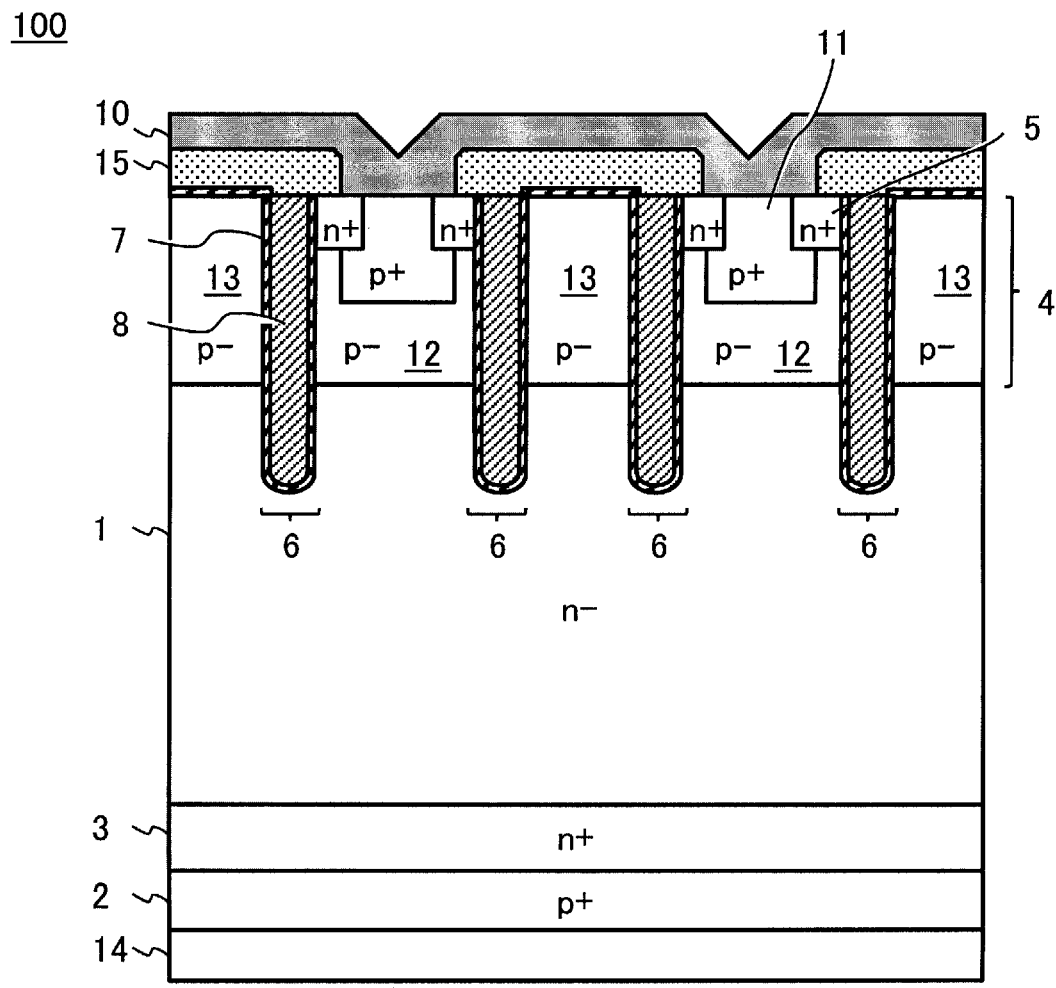
FIG. 1 shows an exemplary configuration of a semiconductor device 100 according to a first embodiment.

FIG. 1 shows an exemplary configuration of a semiconductor device 100 according to a first embodiment. The semiconductor device 100 is an example of an n channel IGBT including a plurality of trenches 6. A p+ collector region 2 and an n+ buffer layer 3 are provided on a back surface side of a silicon substrate forming an n− drift layer 1, and a p layer 4 is provided on the front surface side of this silicon substrate.

An n+ emitter region 5 is selectively provided inside the p layer 4. A trench 6 that penetrates through the p layer 4 in the depth direction and reaches the n− drift layer 1 is provided in the region adjacent to the n+ emitter region 5. A gate electrode 8 and a gate insulating film 7 that surrounds the gate electrode 8 are provided within the trench 6. The gate insulating film 7 is a thermal oxide film, for example. The gate electrode 8 is electrically insulated from an emitter electrode 10 by a low-dielectric-constant film 15 covering the upper portion of the gate electrode 8. The emitter electrode 10 is electrically connected to a p− base region 12, a p+ base region 11, and the n+ emitter region 5 via a contact hole provided in the low-dielectric-constant film 15. The emitter electrode 10 may be grounded, or may have a negative voltage applied thereto. A collector electrode 14 is provided on the back surface side of the semiconductor device 100. A positive voltage is applied to the collector electrode 14.

The p layer 4 is divided into p− base regions 12 and floating p regions 13 by a plurality of trenches 6. In each p− base region 12, an n+ emitter region 5 and a p+ base region 11 with a higher concentration than the p− base region 12 are provided. In other words, when the semiconductor device 100 is in the ON state, a channel is formed in the p− base region 12.

No n+ emitter regions 5 or p+ base regions 11 are formed in the floating p regions 13. Each floating p region 13 is in an electrically floating state. Specifically, the floating p region 13 is electrically insulated from the emitter electrode 10 by the low-dielectric-constant film 15 and the gate insulating film 7 covering the front surface of the p layer 4. Furthermore, the floating p region 13 is electrically insulated from the n− drift layer 1 by the pn junction between the floating p region 13 and the n− drift layer 1, and is also electrically insulated from the gate electrode 8 by the gate insulating film 7. When forming the floating p region 13 in the p layer 4, positive holes that are injected into the n− drift layer 1 from the collector electrode 14 side in the ON state are accumulated in the floating p region 13. In other words, the positive holes injected into the n− drift layer 1 from the collector electrode 14 side are difficult to expel to the emitter electrode 10. As a result, the carrier density distribution of the n− drift layer 1 is increased. Accordingly, by forming the floating p region 13, the ON resistance of the semiconductor device 100 can be decreased.

The low-dielectric-constant film 15 is an insulating film with a low dielectric constant provided between the floating p region 13 and the emitter electrode 10. The dielectric constant of the low-dielectric-constant film 15 may be lower than the dielectric constant of the gate insulating film 7. The dielectric constant of the low-dielectric-constant film 15 is less than or equal to 3.9. For example, the dielectric constant of the low-dielectric-constant film 15 may be less than or equal to 3.0, less than or equal to 2.5, or less than or equal to 2.0. The low-dielectric-constant film 15 may be layered on the gate insulating film 7. When a LOCOS (LOCal Oxidation of Silicon) is formed in the semiconductor device 100, the low-dielectric-constant film 15 may be formed on the LOCOS. When the low-dielectric-constant film 15 is used between the floating p region 13 and the emitter electrode 10, the capacitance between the emitter electrode 10 and the floating p region 13 is reduced compared to a case where an insulating film with a high dielectric constant is used. Accordingly, the semiconductor device 100 of the present example can restrict the flow of a displacement current into the gate electrode 8 from the floating p region 13. As an example, the material and thickness of the low-dielectric-constant film 15 may be set such that the capacitance between the gate electrode 8 and the floating p region 13 is greater than six times the capacitance between the emitter electrode 10 and the floating p region 13.

The material of the low-dielectric-constant film 15 may be an inorganic material such as an F-doped $SiO_2$ film (SiOF film) or $SiO_2$ containing Si—H. The material of the low-dielectric-constant film 15 may be an organic and inorganic hybrid material such as an $SiO_2$ film containing carbon (SiOC film) or an $SiO_2$ film containing a methyl group. The material of the low-dielectric-constant film 15 may be an organic material such as parylene resin or polyaryl ether resin. A porous material in which holes are formed in the film for realizing a low dielectric constant may be used in the low-dielectric-constant film 15.

The thickness of the low-dielectric-constant film 15 is selected according to the desired magnitude of the reverse recovery dv/dt. For example, the thickness of the low-dielectric-constant film 15 is less than or equal to 1 μm. The thickness of the low-dielectric-constant film 15 may be less than or equal to 0.7 μm, or less than or equal to 0.6 μm. Furthermore, when a p type dopant is ion-injected, the thickness of the low-dielectric-constant film 15 may be approximately a thickness that the p type dopant penetrates. However, it should be noted that the thickness of the low-dielectric-constant film 15 is preferably greater than the thickness of the gate insulating film 7, which is 100 nm, for example.

There are cases where a dummy gate is formed in the semiconductor device 100. A dummy gate is a trench 6 that is not adjacent to an n+ emitter region 5 or a p+ base region 11. The dummy gate is provided with the same potential as the emitter electrode 10, for example. In this case, when the dummy gate is formed in the floating p region 13, the low-dielectric-constant film 15 is not formed between the dummy gate and the floating p region 13, and therefore the effect of providing the low-dielectric-constant film 15 between the floating p region 13 and the emitter electrode 10 becomes weaker. Therefore, it is preferable that a dummy gate not be formed in the floating p region 13.

Figure 2:
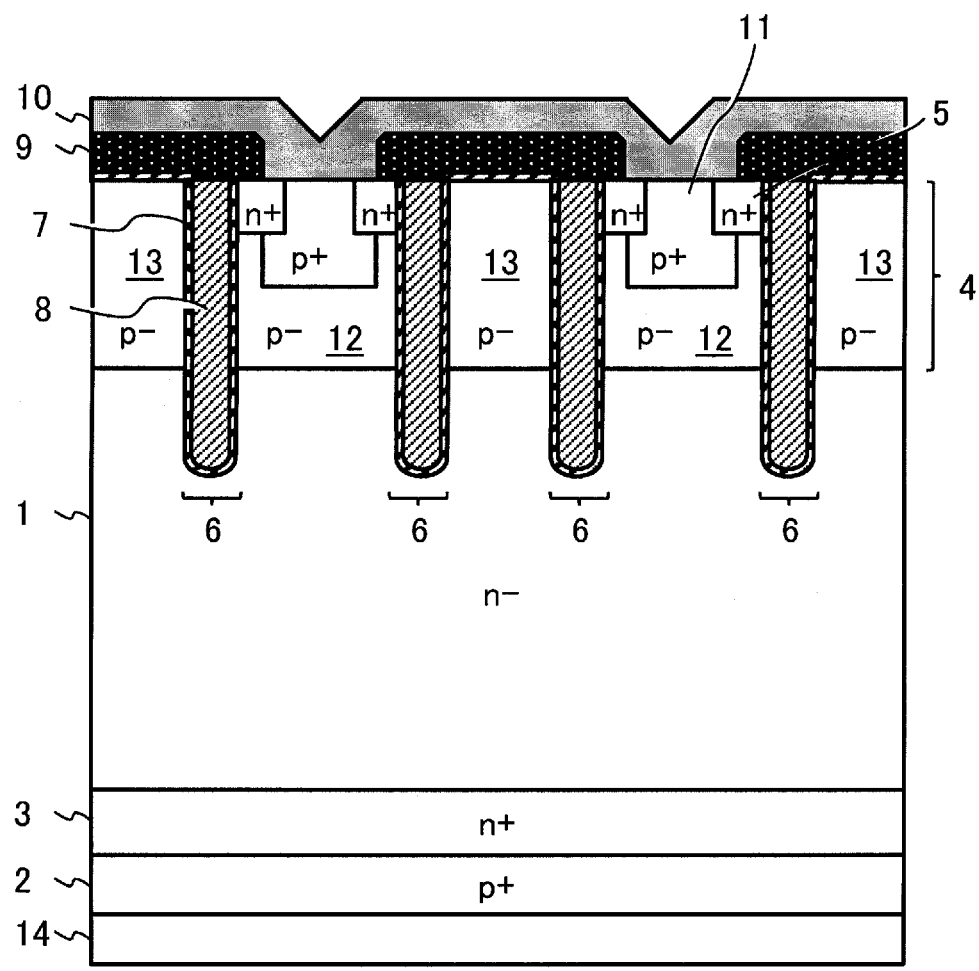
FIG. 2 shows an exemplary configuration of a semiconductor device 500 according to a comparative example.

FIG. 2 shows an exemplary configuration of a semiconductor device 500 according to a comparative example. The semiconductor device 500 of this example differs from the semiconductor device 100 by including an inter-layer insulating film 9 with a high dielectric constant instead of the low-dielectric-constant film 15. Configurational portions that are the same as those of the semiconductor device 100 shown in FIG. 1 are given the same reference numerals.

The inter-layer insulating film 9 is formed by an insulating film with a higher dielectric constant than the low-dielectric-constant film 15. For example, the inter-layer insulating film 9 is an insulating film used in a general semiconductor process, such as an $SiO_2$ film, a BPSG film, or an HTO (High Temperature Oxide) film. The dielectric constant of the BPSG is approximately from 3.9 to 4.3. When an inter-layer insulating film 9 is used between the floating p region 13 and the emitter electrode 10, the capacitance between the emitter electrode 10 and the floating p region 13 increases compared to a case where the low-dielectric-constant film 15 is used. Furthermore, the potential of the floating p region 13 is fixed at the potential of the emitter electrode 10 by capacitive coupling. As a result, a displacement current flows from the floating p region 13 to the gate electrode 8, and the gate electrode 8 is charged by a current that has not passed through the gate resistance $R_g$. Accordingly, the semiconductor device 500 cannot restrict the displacement current from flowing into the gate electrode 8 from the floating p region 13. With C representing the capacitance of the gate insulating film 7 and dv/dt representing the rate of change over time of the collector voltage, the displacement current is expressed as C·dv/dt.

Second Embodiment

Figure 3:
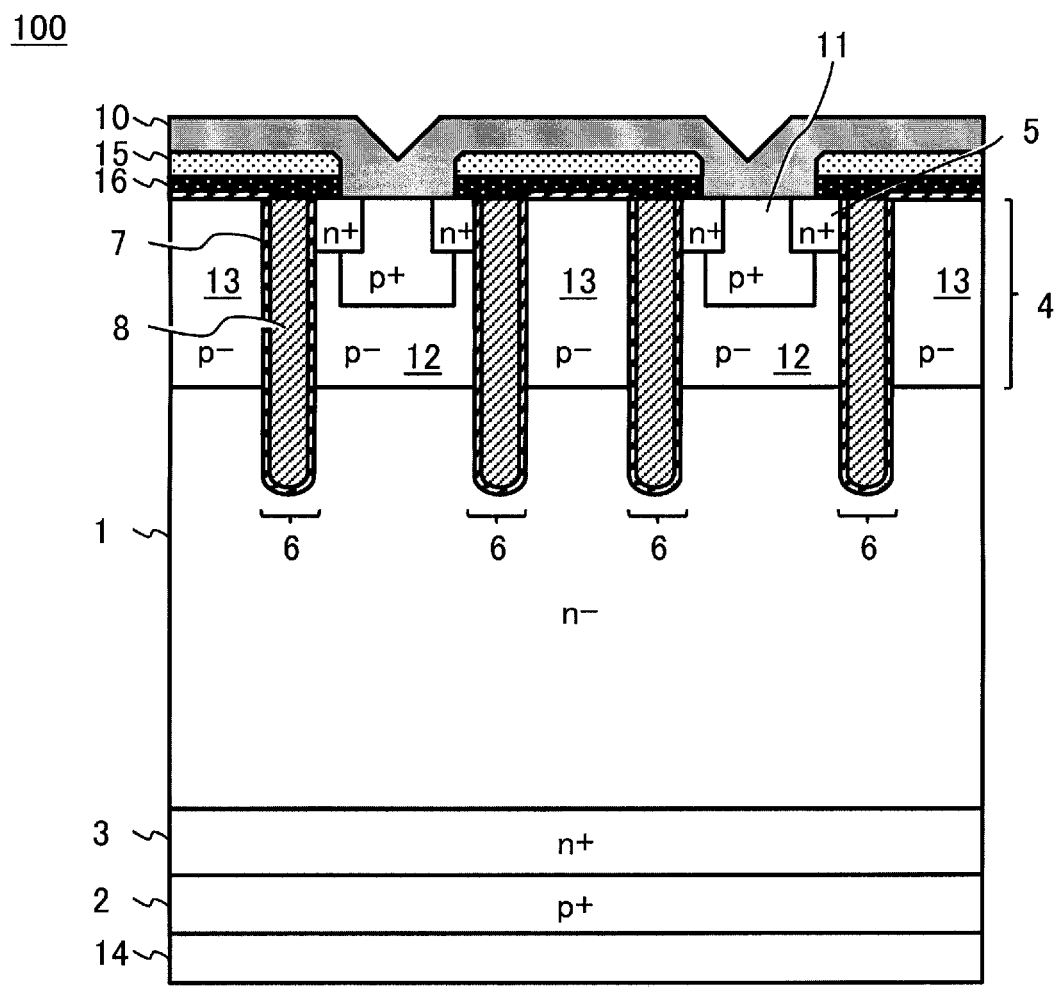
FIG. 3 shows an exemplary configuration of a semiconductor device 100 according to a second embodiment.

FIG. 3 shows an exemplary configuration of a semiconductor device 100 according to a second embodiment. The semiconductor device 100 of this embodiment includes an inter-layer insulating film 9 layered on the low-dielectric-constant film 15.

The layered insulating film 16 is formed between the floating p region 13 and the low-dielectric-constant film 15. The layered insulating film 16 is an insulating film with a higher strength and higher dielectric constant than the low-dielectric-constant film 15. Here, the strength of an insulating film refers to the insulating film having a physical endurance high enough to ensure insulation. High physical endurance means that the insulating film is difficult to crush during the wire bonding. The degree of the strength of the insulating film often changes according to the magnitude of the dielectric constant. Specifically, the strength of the insulating film is higher when the dielectric constant is larger. By layering the layered insulating film 16 having higher strength than the low-dielectric-constant film 15 on the floating p region 13, the reliability during wire bonding is increased. For example, by forming the low-dielectric-constant film 15 and the layered insulating film 16, even when the insulation of the low-dielectric-constant film 15 has been lost, insulation can be preserved by the layered insulating film 16. The thickness of the layered insulating film 16 is preferably greater than the thickness of the low-dielectric-constant film 15.

The layered insulating film 16 of this embodiment is formed by etching after the low-dielectric-constant film 15 and the layered insulating film 16 are layered on the p layer 4. However, the present invention is not limited to this, and any process can be used that enables the layered insulating film 16 to be formed between the low-dielectric-constant film 15 and the emitter electrode 10. Furthermore, the layered insulating film 16 may be provided between the low-dielectric-constant film 15 and the gate insulating film 7, or between the low-dielectric-constant film 15 and the emitter electrode 10.

As described above, the semiconductor device 100 according to the second embodiment has a layered structure including the low-dielectric-constant film 15 and the layered insulating film 16, and is therefore difficult to crush during the wire bonding. Accordingly, the semiconductor device 100 of this embodiment provides high element reliability even when bonded.

Figure 4:
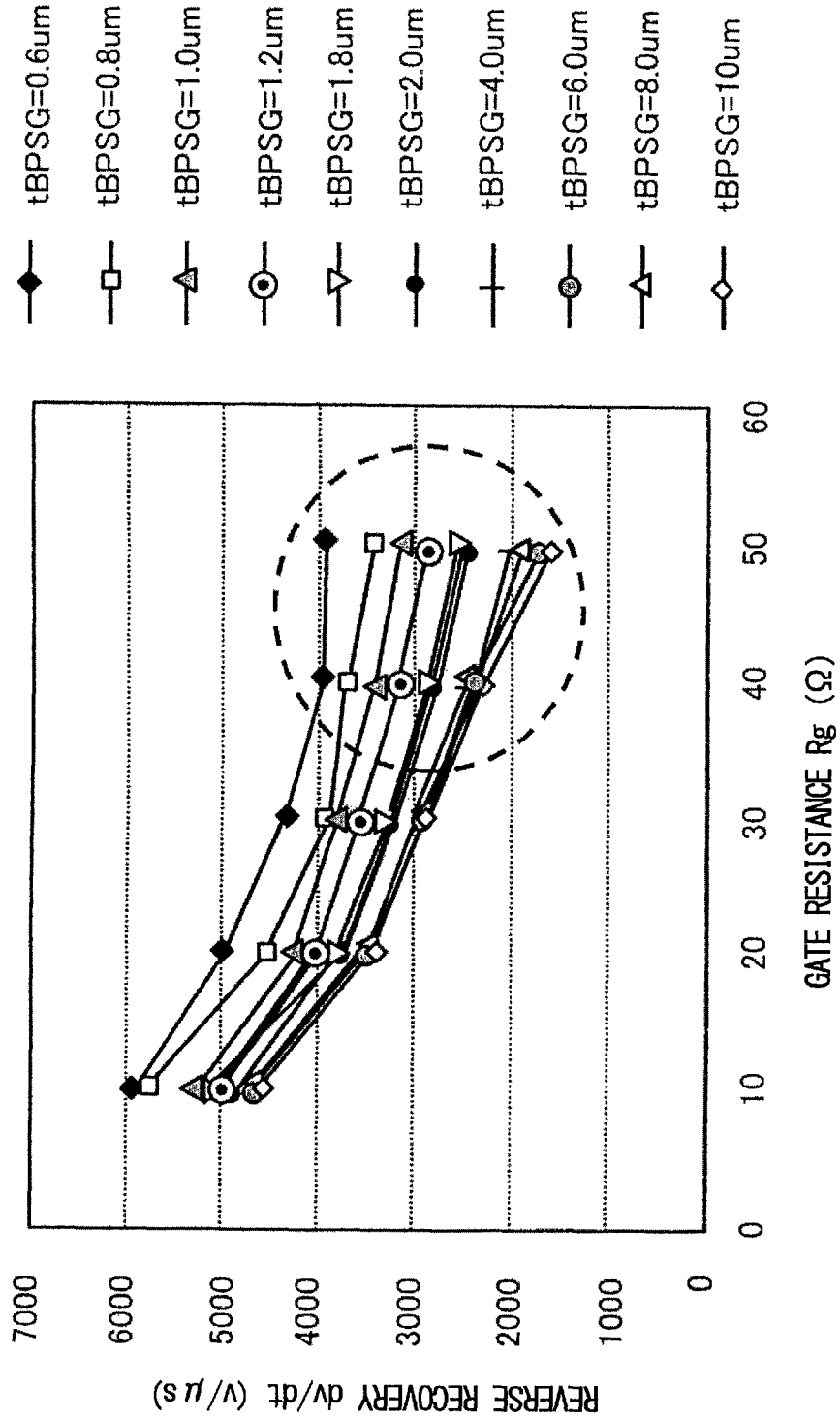
FIG. 4 shows the dependence of the reverse recovery dv/dt on the gate resistance.

FIG. 4 shows the dependence of the reverse recovery dv/dt on the gate resistance. The vertical axis indicates the reverse recovery dv/dt (v/μs) and the horizontal axis indicates the gate resistance $R_g$ (Ω). The semiconductor device of this embodiment has a BPSG film formed between the floating p region 13 and the emitter electrode 10. The thickness of the BPSG film is changed to 0.6 μm, 0.8 μm, 1.0 μm, 1.2 μm, 1.8 μm, 2.0 μm, 4.0 μm, 6.0 μm, 8.0 μm, and 10 μm.

The reverse recovery dv/dt is an indicator that determines characteristics of the semiconductor device when turned ON. The reverse recovery dv/dt indicates the rate of change over time of the collector voltage when the semiconductor device is turned OFF. The reverse recovery dv/dt depends on the charging speed of the gate voltage, and the charging speed of the gate voltage depends on the gate resistance $R_g$. In other words, the reverse recovery dv/dt can be adjusted using the gate resistance $R_g$. For example, in a region where the gate resistance $R_g$ is less than 30Ω, the reverse recovery dv/dt depends on the gate resistance $R_g$ and ignores the thickness of the BPSG film. On the other hand, in a region where the gate resistance $R_g$ is greater than 30Ω, the reverse recovery dv/dt changes less easily when the BPSG film is thinner and changes more easily when the BPSG film is thicker.

The thickness of the BPSG film is proportional to the capacitance of the BPSG film. When the BPSG film is thicker, the decrease in the capacitance between the floating p region 13 and the emitter electrode 10 is greater. Accordingly, the reverse recovery dv/dt changes more easily as the capacitance between the floating p region 13 and the emitter electrode 10 decreases. In other words, as the capacitance between the floating p region 13 and the emitter electrode 10 decreases, the change in the reverse recovery dv/dt caused by changing the gate resistance $R_g$ becomes larger. Accordingly, the control of the reverse recovery dv/dt is improved by using a film with a low dielectric constant as the inter-layer insulating film between the floating p region 13 and the emitter electrode 10.

Figure 5:
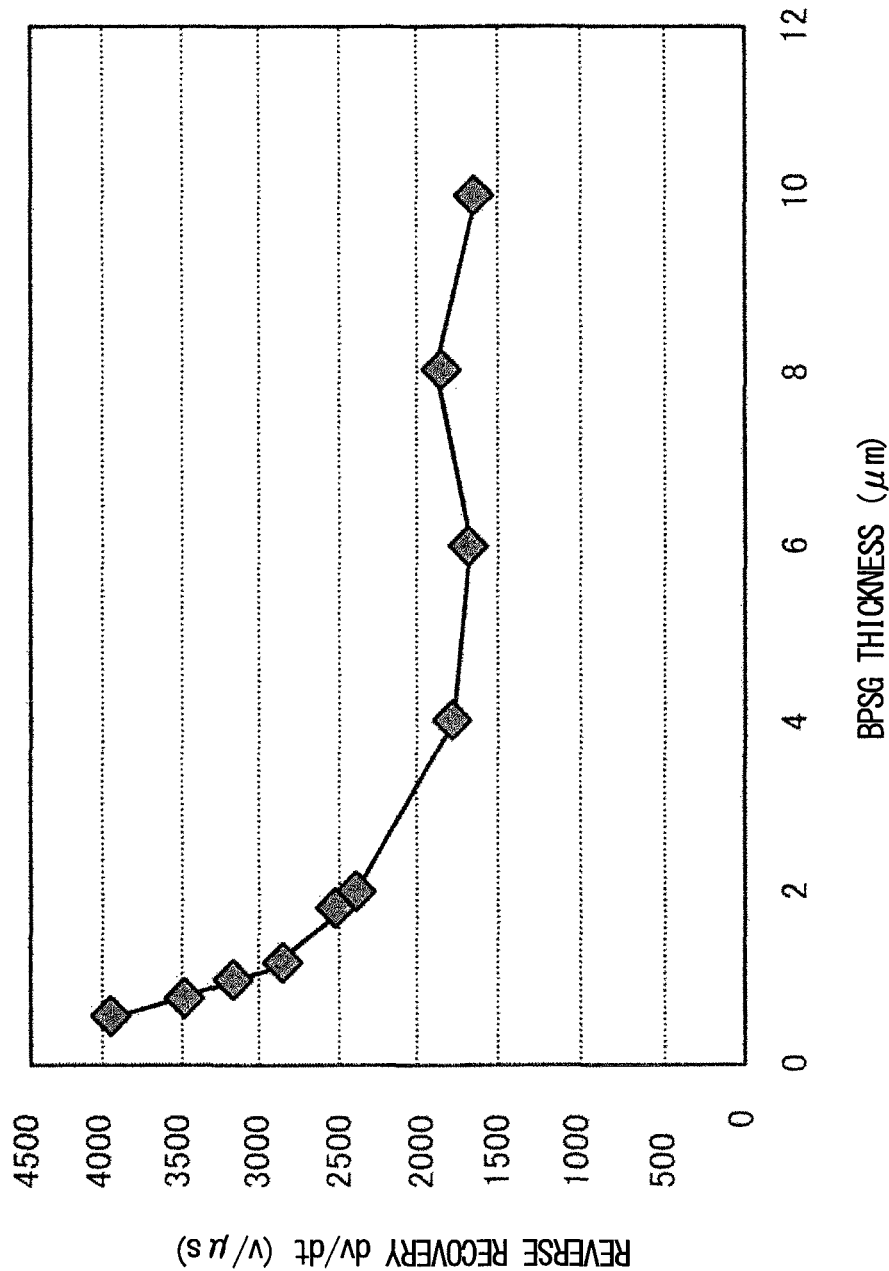
FIG. 5 shows the dependence of the reverse recovery dv/dt on the BPSG thickness.

FIG. 5 shows the dependence of the reverse recovery dv/dt on the BPSG thickness. The vertical axis indicates the reverse recovery dv/dt (v/μs) and the horizontal axis indicates the BPSG thickness (μm). The semiconductor device in this example has a BPSG film formed between the floating p region 13 and the emitter electrode 10, in the same manner as shown in FIG. 4. The gate resistance $R_g$ in this example is 50Ω.

The reverse recovery dv/dt is smaller when the thickness of the BPSG film is greater. In other words, as the capacitance between the floating p region 13 and the emitter electrode 10 decreases, the reverse recovery dv/dt becomes smaller. Furthermore, the reverse recovery dv/dt is saturated at a BPSG thickness of approximately 4 μm.

Figure 6:
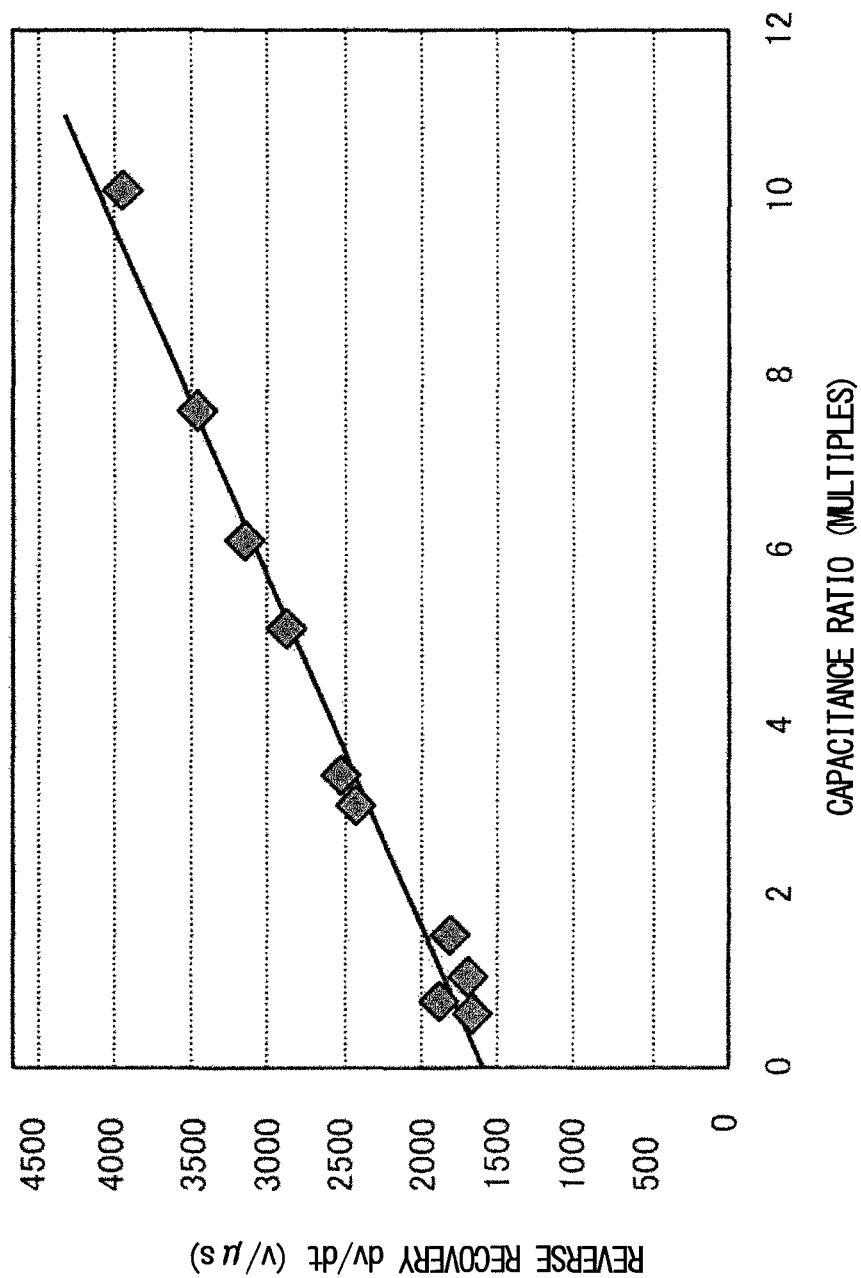
FIG. 6 shows the dependence of the reverse recovery dv/dt on the capacitance ratio.

FIG. 6 shows the dependence of the reverse recovery dv/dt on the capacitance ratio. The vertical axis indicates the reverse recovery dv/dt (v/μs) and the horizontal axis indicates the capacitance ratio (as a multiple). The semiconductor device in this example has a BPSG film formed between the floating p region 13 and the emitter electrode 10, in the same manner as shown in FIGS. 4 and 5. The capacitance ratio represents the ratio of the capacitance of the current BPSG film to the capacitance occurring when the BPSG film has a thickness of 0.6 μm. In other words, the capacitance ratio is 1 for the capacitance occurring when the current BPSG film has a thickness of 0.6 μm. FIG. 6 corresponds to a graph in which the BPSG film thickness shown in FIG. 5 has been replaced with a capacitance ratio. Based on each plotted point, it is understood that the capacitance ratio and the reverse recovery dv/dt have a proportional relationship.

Figure 7:
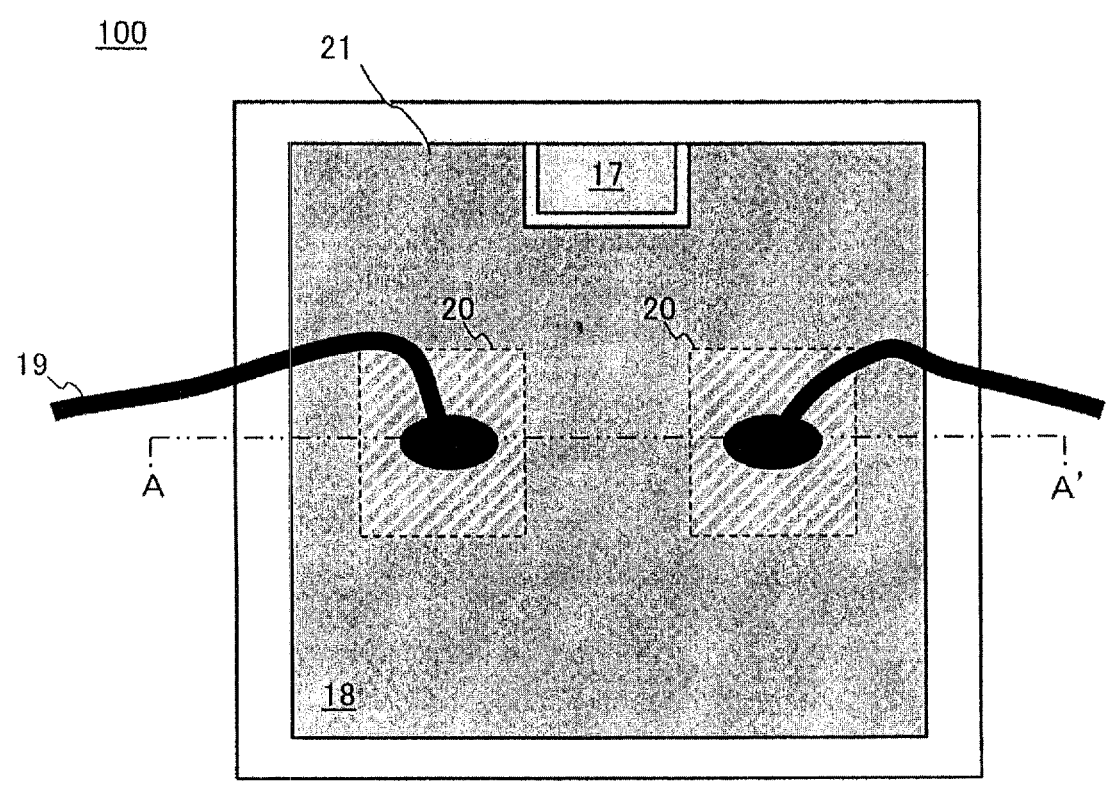
FIG. 7 shows an exemplary top view of the semiconductor device 100.
Figure 8:
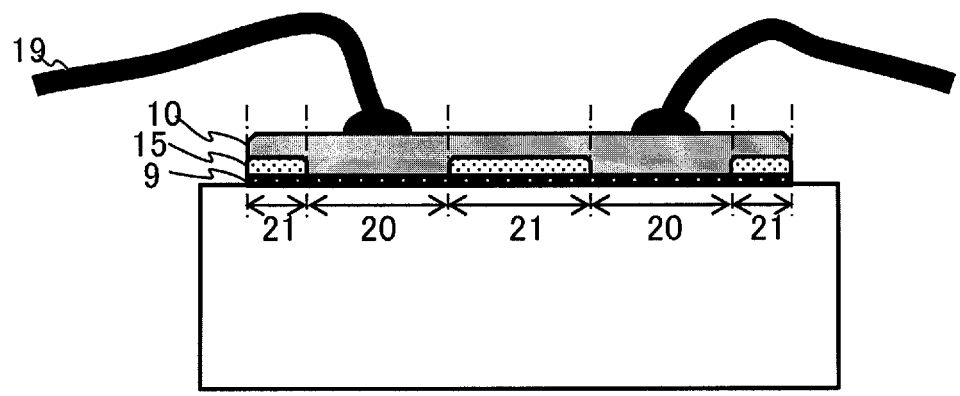
FIG. 8 shows an exemplary cross section over A-A' shown in FIG. 7.

FIG. 7 shows an exemplary top view of the semiconductor device 100. FIG. 8 shows an exemplary cross section over A-A' shown in FIG. 7.

A gate pad 17 and an emitter pad 18 are formed on the top surface of the semiconductor device 100. The gate pad 17 and the emitter pad 18 are respectively electrically connected to the gate electrode 8 and the emitter electrode 10.

The emitter pad 18 includes a wire bonding region 20 and a low-dielectric-constant region 21. The wire bonding region 20 refers to a region in which a wire 19 is bonded. On the other hand, the low-dielectric-constant region 21 refers to a region in which no wire 19 is bonded.

In the wire bonding region 20, the inter-layer insulating film 9 is formed but no low-dielectric-constant film 15 is formed. When a wire 19 is bonded to the wire bonding region 20, there are cases where the insulating film formed on the wire bonding region 20 is crushed. Furthermore, the density of the insulation film is lower when the dielectric constant is lower, and therefore the insulating film is more easily crushed when the dielectric constant is lower. In other words, by forming the inter-layer insulating film 9 and not forming the low-dielectric-constant film 15 in the wire bonding region 20, the low-dielectric-constant film 15 is prevented from being crushed.

In the low-dielectric-constant region 21, the inter-layer insulating film 9 is formed in addition to the low-dielectric-constant film 15. As a result, in the low-dielectric-constant region 21, the capacitance between the floating p region 13 and the emitter electrode 10 can be lowered. Furthermore, the low-dielectric-constant film 15 need only be formed in at least a partial region in the low-dielectric-constant region 21, and it is not absolutely necessary for the low-dielectric-constant film 15 to be formed across the entire surface of the low-dielectric-constant region 21.

As described above, the semiconductor device 100 of this example has different structures for the wire bonding region 20 and the low-dielectric-constant region 21. As a result, the semiconductor device 100 can decrease the capacitance between the floating p region 13 and the emitter electrode 10, and can also ensure insulation between the floating p region 13 and the emitter electrode 10 when bonding a wire 19.

Figure 9:
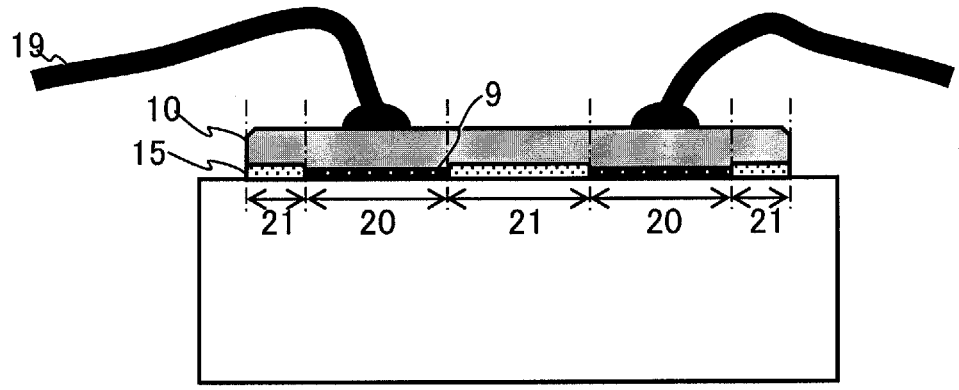
FIG. 9 shows another exemplary cross section over A-A' shown in FIG. 7.

FIG. 9 shows another exemplary cross section over A-A' shown in FIG. 7. In the semiconductor device 100 of this example, the low-dielectric-constant film 15 and the inter-layer insulating film 9 are formed selectively. Specifically, in the low-dielectric-constant region 21, the low-dielectric-constant film 15 is formed and the inter-layer insulating film 9 is not formed.

In the wire bonding region 20, the inter-layer insulating film 9 is formed and the low-dielectric-constant film 15 is not formed. However, in order to decrease the capacitance between the floating p region 13 and the emitter electrode 10, a layered film including both the low-dielectric-constant film 15 and the inter-layer insulating film 9 may be used in the wire bonding region 20. In this case, even if the low-dielectric-constant film 15 is crushed by the bonding of a wire 19, it is possible to ensure insulation between the floating p region 13 and the emitter electrode 10 by the inter-layer insulating film 9. Whether to use the inter-layer insulating film 9, the low-dielectric-constant film 15, or the layered film including the inter-layer insulating film 9 and the low-dielectric-constant film 15 in each wire bonding region 20 and low-dielectric-constant region 21 may be determined according to the desired reliability during wire bonding and the desired controllability of the reverse recovery dv/dt.

While the embodiments of the present invention have been described, the technical scope of the invention is not limited to the above described embodiments. It is apparent to persons skilled in the art that various alterations and improvements can be added to the above-described embodiments. It is also apparent from the scope of the claims that the embodiments added with such alterations or improvements can be included in the technical scope of the invention.

The operations, procedures, steps, and stages of each process performed by an apparatus, system, program, and method shown in the claims, embodiments, or diagrams can be performed in any order as long as the order is not indicated by "prior to," "before," or the like and as long as the output from a previous process is not used in a later process. Even if the process flow is described using phrases such as "first" or "next" in the claims, embodiments, or diagrams, it does not necessarily mean that the process must be performed in this order.

As made clear from the above, according to the embodiments of the present invention, it is possible to realize a semiconductor device having a low-dielectric-constant film with a dielectric constant less than 3.9.

What is claimed is:
1. A semiconductor device comprising:
an emitter electrode;
a plurality of trenches;
a floating layer of a first conduction type provided between adjacent trenches of the plurality of trenches;
a low-dielectric-constant film provided between the floating layer and the emitter electrode, wherein
a dielectric constant of the low-dielectric-constant film is less than 3.9, and the semiconductor device further comprises (i) a first inter-layer insulating film, having a dielectric constant higher than the dielectric constant of the low-dielectric-constant film, provided between the low-dielectric-constant film and the floating layer, and (ii) a second inter-layer insulating film, having a dielectric constant higher than the dielectric constant of the low-dielectric-constant film, provided between the low-dielectric-constant film and the first inter-layer insulating film.

2. The semiconductor device according to claim 1, further comprising:
a gate electrode formed in the trenches, wherein
a capacitance between the gate electrode and the floating layer is greater than six times a capacitance between the emitter electrode and the floating layer.

3. The semiconductor device according to claim 1, wherein
a thickness of the low-dielectric-constant film is less than or equal to 1 μm.

4. The semiconductor device according to claim 1, wherein
a material of the low-dielectric-constant film includes any one of SiOF, SiOC, $SiO_2$ containing Si—H, $SiO_2$ containing a methyl group, a parylene resin, a polyarylether resin, and a porous material.

5. The semiconductor device according to claim 1, wherein
a thickness of the first inter-layer insulating film is less than a thickness of the low-dielectric-constant film.

6. The semiconductor device according to claim 1, wherein
the first inter-layer insulating film is a thermal oxide film.

7. The semiconductor device according to claim 1, wherein
the first inter-layer insulating film is a LOCOS film.

8. The semiconductor device according to claim 1, wherein
the second inter-layer insulating film is thicker than the first inter-layer insulating film.

9. The semiconductor device according to claim 1, wherein
a region in which the emitter electrode is formed, in a plane orthogonal to a layering direction of the semiconductor device, includes:
a first region in which the low-dielectric-constant film and the second inter-layer insulating film are formed; and
a second region in which the second inter-layer insulating film is formed and the low-dielectric-constant film is not formed.

10. The semiconductor device according to claim 9, wherein
the emitter electrode is connected to a wire for wire bonding in the second region.

11. A semiconductor device comprising:
an emitter electrode;
a plurality of trenches;
a floating layer of a first conduction type provided between adjacent trenches of the plurality of trenches;
a low-dielectric-constant film provided between the floating layer and the emitter electrode, wherein
a dielectric constant of the low-dielectric-constant film is less than 3.9, and the semiconductor device further comprises (i) a first inter-layer insulating film, having a dielectric constant higher than the dielectric constant of the low-dielectric-constant film, provided between the low-dielectric-constant film and the floating layer, and (ii) a second inter-layer insulating film, having a dielectric constant higher than the dielectric constant of the low-dielectric-constant film, provided between the low-dielectric-constant film and the emitter electrode.

12. The semiconductor device according to claim 11, wherein the second inter-layer insulating film is thicker than the first inter-layer insulating film.

13. The semiconductor device according to claim 11, wherein a region in which the emitter electrode is formed, in a plane orthogonal to a layering direction of the semiconductor device, includes:

a first region in which the low-dielectric-constant film and the second inter-layer insulating film are formed; and a second region in which the second inter-layer insulating film is formed and the low-dielectric-constant film is not formed.

14. The semiconductor device according to claim 13, wherein the emitter electrode is connected to a wire for wire bonding in the second region.

* * * * *